United States Patent
Stanisic et al.

(10) Patent No.: US 8,497,692 B2
(45) Date of Patent: Jul. 30, 2013

(54) RESISTANCE MEASUREMENT IN HIGH POWER APPARATUS ENVIRONMENTS

(75) Inventors: Zoran Stanisic, Täby (SE); Heinz Wernli, Oberkulm (CH); Romain Douib, Uppsala (SE); Nils Wäcklen, Täby (SE)

(73) Assignee: Megger Sweden AB, Taby (SE)

(*) Notice: Subject to any disclaimer, the term of this patent is extended or adjusted under 35 U.S.C. 154(b) by 319 days.

(21) Appl. No.: 12/937,271

(22) PCT Filed: Apr. 21, 2009

(86) PCT No.: PCT/SE2009/050410
§ 371 (c)(1),
(2), (4) Date: Dec. 23, 2010

(87) PCT Pub. No.: WO2009/131530
PCT Pub. Date: Oct. 29, 2009

(65) Prior Publication Data
US 2011/0084715 A1    Apr. 14, 2011

Related U.S. Application Data

(60) Provisional application No. 61/046,556, filed on Apr. 21, 2008.

(51) Int. Cl.
*G01R 27/08* (2006.01)
(52) U.S. Cl.
USPC .......................................... 324/713; 324/525

(58) Field of Classification Search
USPC .......................... 324/519, 523–525, 712–713
See application file for complete search history.

(56) References Cited

U.S. PATENT DOCUMENTS

| | | | |
|---|---|---|---|
| 3,731,189 A * | 5/1973 | Sharaf et al. | 324/710 |
| 3,816,812 A | 6/1974 | Alber et al. | |
| 2002/0000785 A1* | 1/2002 | Ganz | 320/101 |
| 2006/0264189 A1* | 11/2006 | Turner et al. | 455/127.1 |

FOREIGN PATENT DOCUMENTS

| | | |
|---|---|---|
| CN | 101021557 A | 8/2007 |
| GB | 855970 A | 12/1960 |
| WO | 02091003 A1 | 11/2002 |

OTHER PUBLICATIONS

International Search Report for PCT/SE2009/050410 mailed Jul. 3, 2009.

* cited by examiner

*Primary Examiner* — Vincent Q Nguyen
(74) *Attorney, Agent, or Firm* — Potomac Patent Group, PLLC

(57) ABSTRACT

Systems and methods can be provided for measuring the resistance of high power apparatuses. A device can include a current source connectable to a test object, and the ability for measuring current and/or voltage, wherein the current source is a capacitor. By providing the current source as a capacitor, a light weight device is obtained which can be used essentially continuously without periods of non-use during recharging.

22 Claims, 3 Drawing Sheets

RESISTANCE MEASUREMENT IN HIGH POWER APPARATUS ENVIRONMENTS

FIELD OF INVENTION

The present invention relates generally to a device for measuring resistance in high power apparatuses, such as circuit breakers, bus bars, ground grids and disconnector switches, and more particularly to a measuring device comprising a high capacitive capacitor for generating a high current through the measured object.

BACKGROUND

There is a need for measurement of resistance in the range of $\mu\Omega$-$m\Omega$ of any high voltage environment object, such as circuit breakers, bus bars, contacts, joints, ground grids etc. based on temporary high current generation.

One way of achieving such measurement is to generate and apply a high current, more than 100 Amperes and preferably more than 250 Amperes during a short time (a few seconds and preferably less than two seconds) to measure extremely low resistances from less than 1 $\mu\Omega$ to 20 m$\Omega$ as a static value (Static Resistance Measurement—SRM) or as a high frequency sampled time series (Dynamic Resistance Measurement—DRM) for evaluation of arcing contact length, contact timing, corrosion or otherwise caused increase of resistance in circuit breaker contacts, bus bars and joints for the diagnosis of quality, such as if the product is conformant with product specification, on new objects and the need for maintenance on installed equipment. Having a high current is important for achieving high resolution and reliability in the DRM measurement. The measured voltage across the circuit breaker is proportional to the current through the very low resistance, according to Ohm's law. The higher the current, the better resolution.

Conventional prior art measuring devices are bulky and heavy due to the batteries or accumulators, often lead batteries, provided in the device for providing the high current required for accurate measurement.

Thus, it would be advantageous if a light weight measuring device could be provided, which also could sustain essentially continuous operation without requiring long time battery recharging.

SUMMARY OF THE INVENTION

An object of the present invention is to provide a measuring device for high voltage apparatus environments, which is easy to use and provides for continuous operation.

The invention is based on the realization that the use of high capacitance capacitors in high voltage measuring devices brings advantages in weight of equipment and operation duration among other things.

Thus, there is provided a measuring device for measuring the resistance of high power apparatuses, the measuring device comprising a current source connectable to a test object, and means for measuring, the measuring device being characterized in that the current source is a capacitor.

By using a capacitor as current source, the weight of the measuring device is kept to a minimum, facilitating the use thereof.

In a preferred embodiment, the capacitor has a capacitance of at least 100 Farads, thereby providing adequate current to an object to be tested.

In a preferred embodiment, the device comprises a charger connected to the current source and adapted for essentially continuous charging of the current source. Thereby, recharging periods during which the device cannot be used are avoided. In one embodiment, the charger is a regulated constant current source, allowing very low power DC to DC converter versus rated current needed to charge the capacitor.

In an alternative embodiment, the current source comprises two capacitors in bipolar connection. The usage of two capacitors in bipolar connection reduces the remanence of the inductors tested, such as current transformers. By alternating discharge of capacitors the remaining magnetization is decreased.

In one embodiment, the measuring device is adapted for dynamic resistance measurement by comprising voltage measuring means adapted for measuring the voltage across the capacitor. No measurement on capacitor current is then needed and no voltage sense and leads are needed on the test object.

Further preferred embodiments are defined in the dependent claims.

BRIEF DESCRIPTION OF DRAWINGS

The invention is now described, by way of example, with reference to the accompanying drawings, in which.

DETAILED DESCRIPTION OF A PREFERRED EMBODIMENT

In the following, a detailed description of preferred embodiments of a measuring device according to the invention will be given.

In the following description and claims, the term high power is used. It is to be understood that this term is intended to cover voltages of at least 400 volts or at least 10 kilovolts and up to 1 Megavolts.

Figure 1:
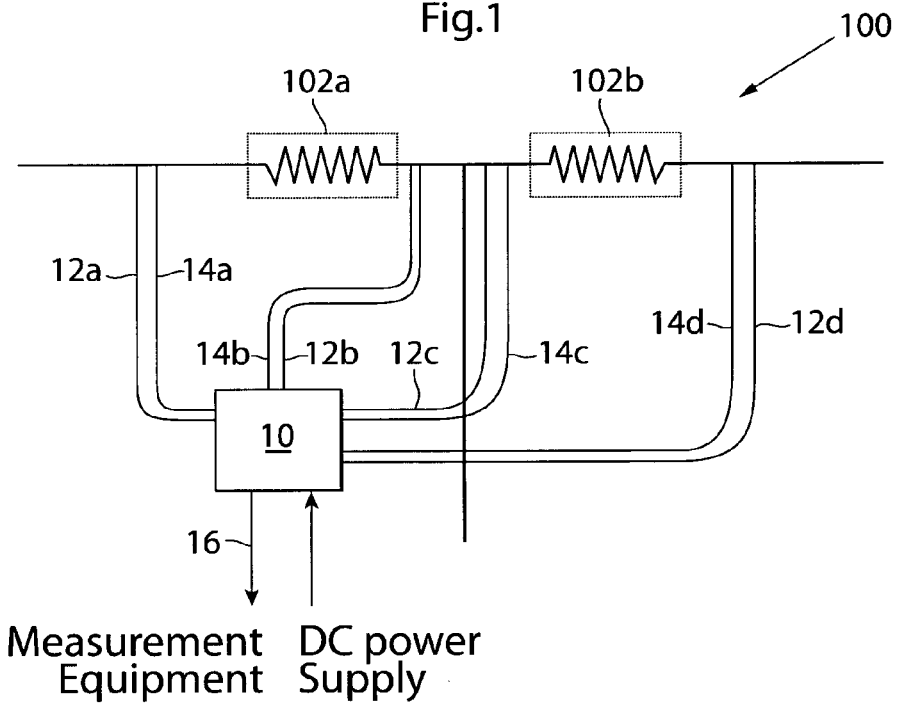
FIG. 1 is a schematic diagram showing a measuring device connected for measuring the resistance of a circuit breaker.

First with reference to FIG. 1, the general configuration of a measuring device is shown, in this case connected to a test object in the form of a circuit breaker for measuring the internal resistance of this circuit breaker. The measuring device, generally designated 10, is connected to the circuit breaker, designated 100, by means of two pairs of current injection cables 12a, 12b and 12c, 12d, respectively. Each pair of current injection cables is connected on either side of an insulator 102a, 102b of the circuit breaker 100. Each insulator comprises or houses a breaking device for interrupting current flowing through the circuit breaker.

It will be appreciated that the measuring is conducted during non-operation of the high voltage apparatus, i.e., when the apparatus is disconnected from the high voltage. However, it is often the case that other apparatuses close to the test object are live, creating interference from capacitively and inductively coupled currents, high frequency disturbances from arching etc.

The current provided through the current injection cables 12a-d is provided by means of a high capacitance capacitor (not shown in FIG. 1). It is preferred that the capacitance of the capacitor is at least 100 Farads, more preferably at least 300 Farads, and even more preferably at least 350 Farads. It is also preferred that the capacitor is adapted to generate a current of at least 100 Amperes, preferably more than Amperes, and even more preferably more than 500 Amperes during a relatively short time period, such as less than 2 seconds.

The measuring device 10 is further connected to the circuit breaker 100 by means of two pairs of sense leads 14a, 14b and 14c, 14d, respectively. Each pair of sense leads is connected on either side of the insulators 102a, 102b of the circuit breaker 100 to measure the voltage across the respective interrupter.

The resistance in each breaking point can be calculated by using Ohm's law, i.e., R=U divided by I.

The measuring device 10 is powered by means of a DC power supply and measurement data is output through an output data cable 16

Figure 2:
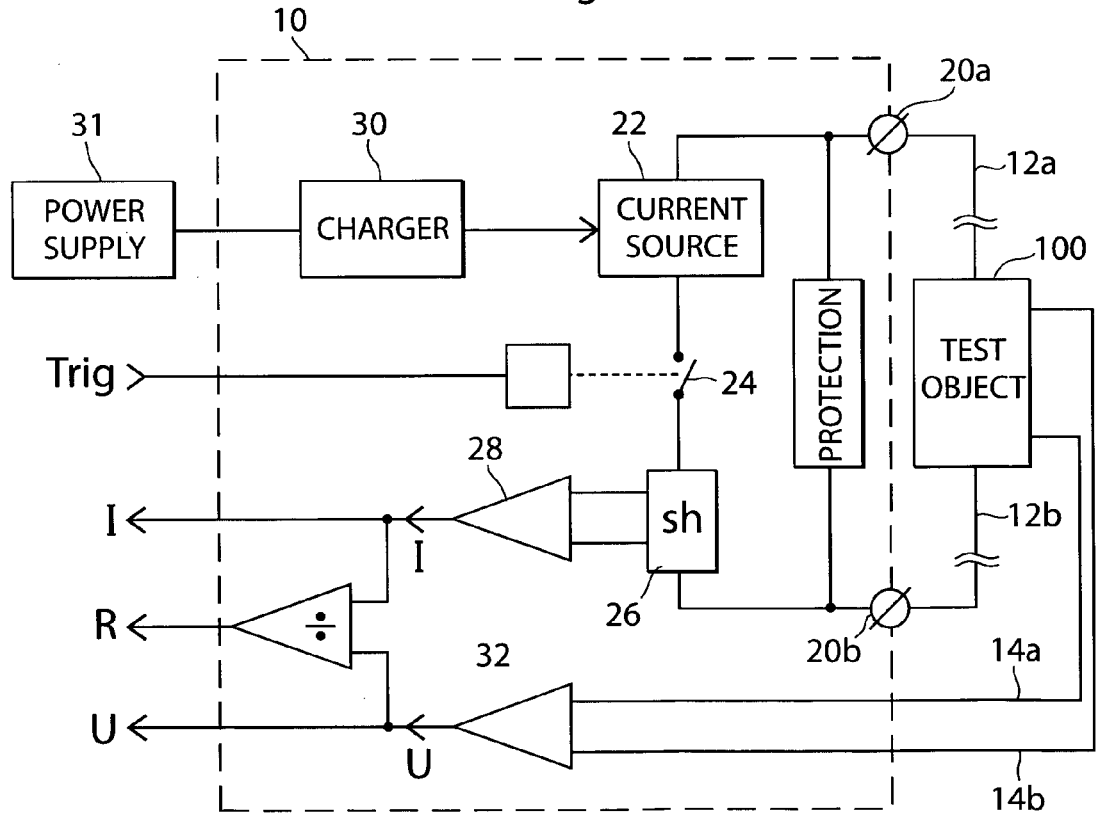
FIG. 2 is a block diagram showing in more detail a measuring device according to the invention.

The measuring device 10 will now be described in more detail with reference to FIG. 2, showing a block diagram. The measuring device comprises two current outputs 20a, 20b, which are connected to either side of a test object 100 by means of two current injection cables 12a, 12b, having a length that preferably is less than five meters to reduce the resistance and thereby provide for a high current through the test object. The current is provided from a current source 22, in the inventive device the above mentioned high capacitance capacitor. An example of such high capacitance capacitors, electric double-layer capacitors, also known as Ultracapacitors or Supercapacitors, is sold by the company Maxwell Technologies, Inc. under the trademark BOOSTCAP®. With for example the capacitor BCAP0350, the following result has been achieved:

Theory: ESR 3.2 mOhm, V=2.5V, I max>700A
Practical case I=250A with cable: 16 mm2 (4.5 m)+Mosfet+ Measuring shunt 0.25 mOhm Another advantage with these capacitors is their relatively low serial resistance.

The capacitor is preferably adapted to generate the current during a time period of less than five seconds, more preferably during a time period of less than two seconds.

The current source 22 is connected to the outputs 20a, 20b via a switch 24 and a shunt 26, which, together with a first measuring amplifier 28, provide a signal proportional to the current through the test object 100. The switch 24 is controlled by means of a trigger signal Trig so as to provide the desired operational mode, controlling current pulse length etc.

The current source is charged, preferably continuously, by means of a power supply 31, which can be any conventional AC/DC power supply, and a charger 30 which is connected to the power supply 31. The charger 30 is preferably a regulated constant current source. By continuously charging the current source, the measuring device can be used essentially continuously, with short breaks for recharging the current source.

A second measuring amplifier 32 is connected to the test object 100 by means of a pair of sense leads 14a, 14b, and provides on its output a signal proportional to the voltage across the test object.

A dividing circuit 34 is connected to the first and second measuring amplifiers 28, 32, so as to output the sensed voltage U divided by the sensed current I, the output signal being proportional to the resistance R of the test object.

Figure 3:
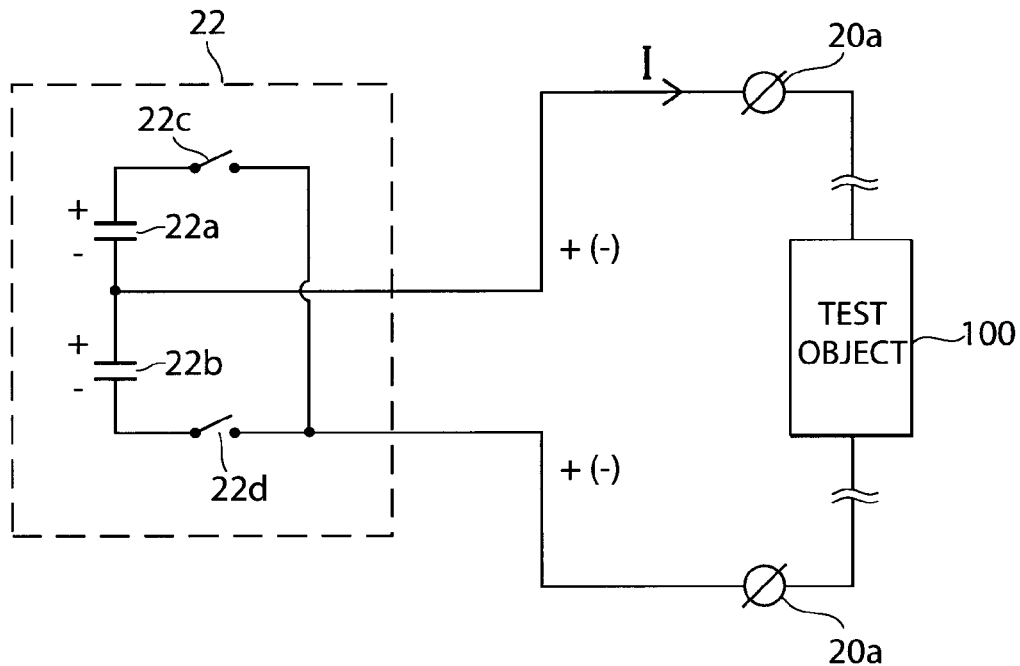
FIG. 3 is an overall diagram showing the use of two capacitors in bipolar connection.
Figure 4:
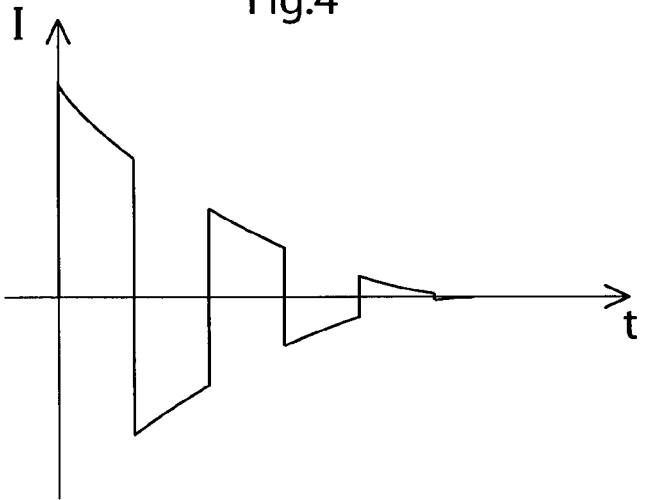
FIG. 4 is a graph showing the current though the test object.

An alternative embodiment of a measuring device will now be described with reference to FIG. 3, showing only the current source 22 and the test object 100 with connections. In this embodiment, the current source 22 comprises two capacitors 22a, 22b in bipolar connection. Thus, both the first capacitor 22a and the second capacitor 22b are charged to the polarity indicated in the figure by a charger (not shown in FIG. 3). When current is injected into the test object 100, the direction of the current is regularly reversed by switching the capacitors in and out by means of switches 22c, 22d. The resulting current through the test object 100 is shown schematically in the diagram of FIG. 4.

By means of this switching, the remanence of the inductors tested, such as current transformers, is reduced. By alternating discharge of capacitors the remaining magnetization is decreased.

It will be appreciated that this principle is also applicable to other embodiments than the one described above with reference to FIG. 2.

Yet an embodiment of a measuring device will now be described with reference to FIG. 5. This device is adapted to be used with so-called Dynamic Resistance Measurement (DRM). This measurement principle is very straightforward. Basically, it is a contact resistance test but instead of taking a single value when the breaker contacts are closed (static value), the resistance is measured versus time during a breaker operation, preferably from closed to open position. The measurement can be described in the following steps:
1. Inject a high (150-200 A) current through the test object.
2. Measure voltage across the capacitor of the current source during operation of the test object.
3. Calculate the resistance versus time.

Alternatively, in step 2, current through the test object and voltage drop across the test object are measured during operation thereof.

The capacitor and the test object together with leads form an RC circuit, wherein the capacitance C is a constant. Thus, with the voltage Ucap across the capacitor known, the total resistance Rtot can be calculated according to the following formula:

$$Rtot = -\frac{t}{C \cdot \ln\frac{Ucap}{U\max}}$$

wherein Rtot is the sum of the serial resistance of the capacitor, resistance of connecting cables, resistance of connectors, and the resistance of the test object, C is the capacitance of the current source capacitor, Ucap is the instant voltage across this capacitor, and Umax is the initial voltage across this capacitor.

The resistance of the test object can then be calculated or at least be approximated if the resistances of the connecting cables, connectors, and capacitor are known.

Figure 5:
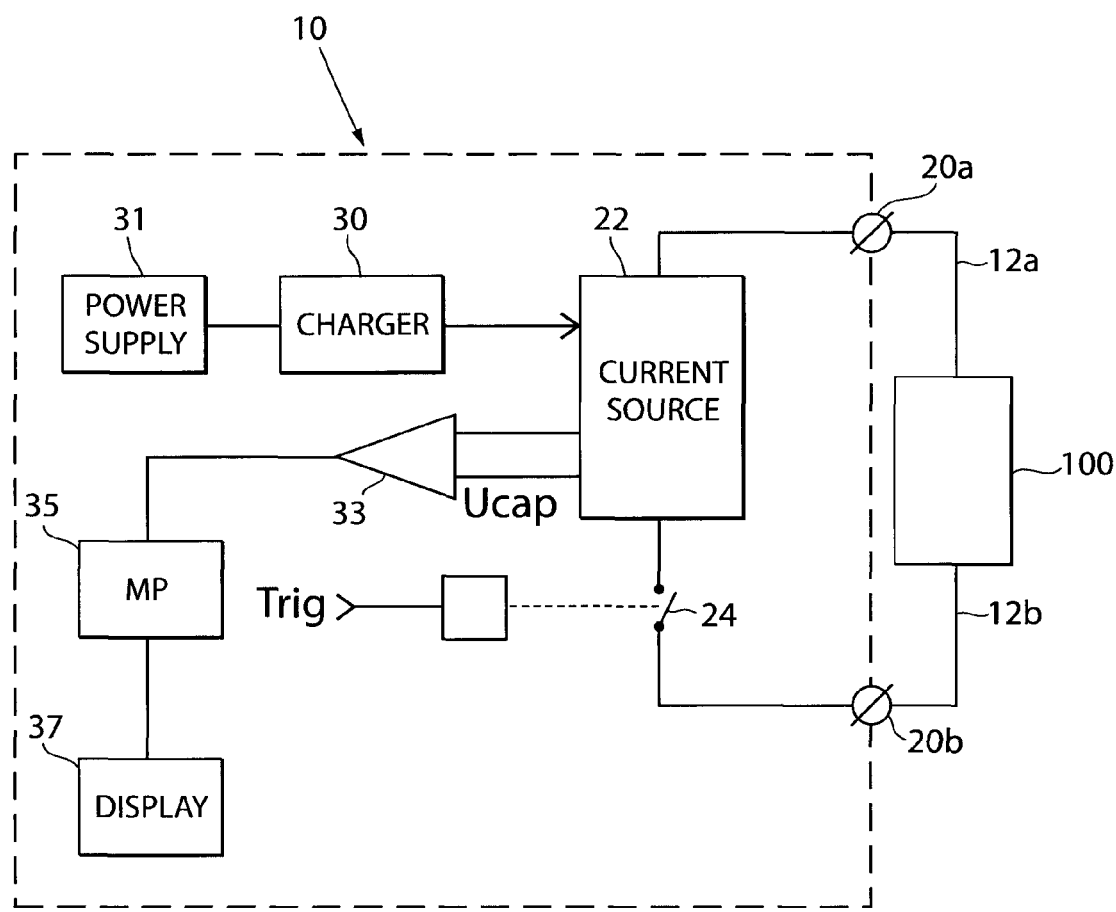
FIG. 5 is a block diagram of an alternative embodiment of a measuring device.

A simplified block diagram of a measurement device for use with DRM is shown in FIG. 5. The voltage Ucap across the capacitor of the current source 22 is measured by means of a measuring amplifier 33, processed in a computer 35 according to the above formula and the result is optionally displayed on a display 37 connected to the computer 35.

Preferred embodiments of a measuring device according to the invention have been described. However, the person skilled in the art realizes that this can be varied within the scope of the appended claims without departing from the inventive idea.

It is realized that the measuring device can be provided with one or more pairs of current injection cables and sense leads, depending on the number of test objects that are to be tested simultaneously with the measuring device.

The invention claimed is:

1. A measuring device for measuring the resistance of high power apparatuses, the measuring device comprising:
   a current source connectable to a test object, and
   means for measuring,
   wherein
   the current source is a capacitor,
   the capacitor is adapted to generate a current of at least 100 Amperes, and
   the capacitor is adapted to generate the current during a time period of less than five seconds, more preferably during a time period of less than two seconds.

2. The measuring device according to claim 1, wherein the means for measuring comprises:
   current measuring means adapted for measuring current flowing through the test object, and
   voltage measuring means adapted for measuring the voltage across the test object.

3. The measuring device according to claim 2, comprising a pair of current injection cables connected to the current source, and a pair of sense leads connected to the voltage measuring means and connectable to the test object.

4. The measuring device according to claim 3, comprising a plurality of current injection cable pairs and a plurality of sense lead pairs.

5. The measuring device according to claim 1, wherein the means for measuring comprises:
   voltage measuring means adapted for measuring the voltage across the capacitor.

6. The measuring device according to claim 1, wherein the capacitor has a capacitance of at least 100 Farads.

7. The measuring device according to claim 6, wherein the capacitor has a capacitance of at least 350 Farads.

8. The measuring device according to claim 7, wherein the capacitor has a capacitance of at least 600 Farads.

9. The measuring device according to claim 1, wherein the capacitor is an electric double-layer capacitor.

10. The measuring device according to claim 1, comprising a charger connected to the current source and adapted for essentially continuous charging of the current source.

11. The measuring device according to claim 10, wherein the charger is a regulated constant current source.

12. The measuring device according to claim 1, wherein the capacitor is adapted to generate a current of at least 250 Amperes.

13. The measuring device according to claim 12, wherein the capacitor is adapted to generate a current of at least 500 Amperes.

14. The measuring device according to claim 1, wherein the capacitor is adapted to generate the current during a time period which is determined by the total resistance of the high voltage apparatus.

15. The measuring device according to claim 1, wherein the capacitor is adapted to generate the current during a plurality of time periods.

16. The measuring device according to claim 1, wherein the measuring device is adapted for dynamic resistance measurement.

17. The measuring device according to claim 1, wherein the test object is adapted for operating with voltages of at least 400 Volts.

18. The measuring device according to claim 1, wherein the current source comprises at least two capacitors.

19. The measuring device according to claim 18, wherein the current source comprises two capacitors in bipolar connection.

20. A method of measuring the resistance of high power apparatuses, the method comprising the steps of:
    connecting a current source comprising a capacitor to a test object, measuring a voltage,
    adapting the capacitor to generate a current of at least 100 Amperes,
    adapting the capacitor to generate the current during a time period of less than five seconds, more preferably during a time period of less than two seconds, and
    based on the measured voltage, determining the resistance of the high power apparatus.

21. The method according to claim 20, wherein the step of measuring a voltage comprises measuring a voltage across the capacitor.

22. The method according to claim 20, wherein the step of measuring a voltage comprises measuring a voltage across the test object, the method further comprising the step of:
    measuring current flowing through the test object by means of current measuring means.

* * * * *